United States Patent [19]

Galvin et al.

[11] Patent Number: 5,106,471

[45] Date of Patent: Apr. 21, 1992

[54] REACTIVE ION ETCH PROCESS FOR SURFACE ACOUSTIC WAVE (SAW) DEVICE FABRICATION

[75] Inventors: Jeffrey L. Galvin, Mesa; Frederick J. Robinson, Scottsdale; David M. Yee, Phoenix, all of Ariz.

[73] Assignee: Motorola, Inc., Schaumburg, Ill.

[21] Appl. No.: 502,728

[22] Filed: Apr. 2, 1990

[51] Int. Cl.$^5$ ................................................ C23F 1/00
[52] U.S. Cl. ............................... 204/192.35; 156/643; 156/656; 156/665; 204/192.32
[58] Field of Search ................... 204/192.32, 192.35, 204/172.18; 156/643, 656, 665

[56] References Cited

U.S. PATENT DOCUMENTS

| | | | |
|---|---|---|---|
| 3,994,793 | 11/1976 | Harvilchuck et al. | 204/192 |
| 4,069,096 | 1/1978 | Reinbert et al. | 156/643 |
| 4,182,646 | 1/1980 | Zajos | 156/643 |
| 4,203,800 | 5/1980 | Kitcher et al. | 156/643 |
| 4,209,349 | 6/1980 | Ho et al. | 148/187 |
| 4,214,946 | 7/1980 | Forget et al. | 156/643 |
| 4,229,233 | 10/1980 | Hansen et al. | 148/1.5 |
| 4,253,987 | 3/1981 | Fiato | 252/429 R |
| 4,264,409 | 4/1981 | Forget et al. | 156/643 |
| 4,283,249 | 8/1981 | Ephroth | 156/643 |
| 4,341,593 | 7/1982 | Kurisaki et al. | 156/643 |
| 4,350,563 | 9/1982 | Takada et al. | 156/643 |
| 4,502,932 | 3/1985 | Kline et al. | 204/192.18 |

OTHER PUBLICATIONS

John L. Vossen et al., Thin Film Processes, Academic Press, New York, 1978, pp. 497–498, 526–528.
Leon I. Maissel et al., Handbook of Thin Film Technology, McGraw-Hill Book Co., New York, 1970, pp. 7-40 to 7-42.
Michael Hill, "Causes and Prevention of Post-Etch Corrosion . . . ", Applied Materials Etch News Bulletin, vol. II, No. 3, Sep. 1986, pp. 1–2.
Shirley Wong et al., "Causes and Prevention of Post--Etch Metal Corrosion", Applied Material Etch News Bulletin, vol. V, No. 1, Feb. 1989, pp. 9–10.
G. Cameron et al., "Successfully Adressing Post-Etch Corrosion", Semiconductor International, May, 1989, pp. 142–147.

Primary Examiner—John Niebling
Assistant Examiner—William T. Leader
Attorney, Agent, or Firm—Robert M. Handy; Jordan C. Powell

[57] ABSTRACT

A dry etch process allows fabrication of very small SAW electrodes (less than 1 micron wide) on LiNbO$_3$ (lithium niobate) or quartz substrates. In the process, an aluminum (Al) layer is disposed on the substrate, and a photoresist layer is applied and exposed in the appropriate pattern. The wafer is then placed in an RIE where the Al is dry etched using a plasma containing chlorine and fluorine. The photoresist is then removed by an oxygen plasma. The oxygen also operates to replace the chlorine ions. By using this process, very precisely shaped electrodes can be formed.

10 Claims, 1 Drawing Sheet

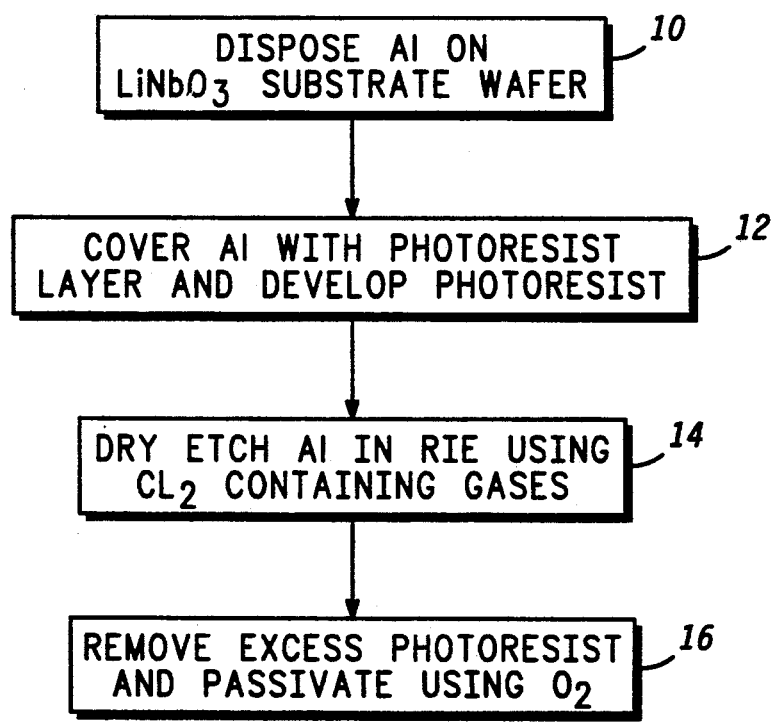

REACTIVE ION ETCH PROCESS FOR SURFACE ACOUSTIC WAVE (SAW) DEVICE FABRICATION

BACKGROUND OF THE INVENTION

This invention relates, in general, to reactive ion etching, and more specifically, to reactive ion etching for surface acoustic wave (SAW) devices.

SAW devices can be designated to provide several signal processing functions such as band pass filtering time delay, compression/expansion, and resonator functions. These SAW devices are frequently utilized in mobile communication units.

The acoustic signal wavelength of the SAW and the transducer feature size are inversely proportional to the RF signal frequency. As the frequency of the signal increases, the seize of the transducer must decrease. Transducers in the microwave frequencies become very small, and the line and space widths are accordingly small.

Conventional methods for fabricating very small transducers use wet chemical etching. A conductor layer is first formed on a wafer substrate, and a photoresist layer is placed on the conductor layer. The photoresist layer is then developed to define the pattern for the conducting metalization layer. The transducer on the wafer is then etched using a wet chemical etchant.

Wet chemical etching conventional methods cannot produce very small electrodes needed for very high frequency ranges. The higher the operating frequency range, the less likely the wet etchant process can fabricate the widths of the electrodes needed. Electrode sizes for frequencies in the microwave range are virtually impossible using conventional wet etching. The reason the wet etching cannot fabricate very fine electrodes is because the wet etchant corrodes in all directions at the same time. Therefore, rather than only etching down to remove the metal between the electrodes, the wet etchant etches into the electrodes themselves.

SUMMARY OF THE INVENTION

Accordingly, it is an object of the present invention to provide a method for accurate construction of SAW electrodes for high frequency signals.

A dry etch process allows fabrication of very small SAW electrodes (less than 1 micron wide) on substrates such as $LiNbO_3$ (lithium niobate) or quartz. In the process, an aluminum (Al) layer is disposed on the substrate, and a photoresist layer is applied and developed in the appropriate pattern. The wafer is then placed in an RIE reactor where the Al is dry etched using a chlorine containing plasma as the primary etchant and carbon tetrafluoride. The excess photoresist is then removed by an oxygen plasma. The oxygen also operates to passivate the aluminum chloride. By using this process, very precisely shaped electrodes can be formed.

The above and other objects, features, and advantages of the present invention will be better understood from the following detailed description taken in conjunction with the accompanying drawings.

BRIEF DESCRIPTION OF THE DRAWING

FIG. 1 is a flow diagram of a process for fabricating very small SAW electrodes.

DETAILED DESCRIPTION OF THE INVENTION

The width of electrodes for surface acoustic wave (SAW) devices are inversely proportional to the magnitude of the frequency which the SAW device is operating at. As the frequency increases, the width of the SAW electrodes must decrease. Therefore, as higher frequencies are used, new methods for producing smaller SAW devices, and narrower electrodes, must be found.

Because of the problems associated with the conventional process of fabricating SAW electrodes, electrode widths have been limited to sizes greater than 1 micron. Through the present invention, electrodes of less than 1 micron can be accurately reproduced.

The Figure shows a flow diagram of a process for fabricating SAW electrodes at widths less than 1 micron. This process has produced electrodes having widths of 0.6 microns.

As indicated in the Figure, in the preferred embodiment an aluminum (Al) layer is disposed onto a lithium niobate ($LiNbO_3$) substrate wafer (shown as box 10). Aluminum alloys may be substituted for pure aluminum, and single crystal quartz may be substituted for the $LiNbO_3$ substrate. Furthermore, other conducting materials which may be etched with chlorine may be substituted in place of aluminum.

After the Al layer has been placed, a photoresist layer is placed on the Al, and the photoresist is developed using a suitable photo-lithographic technique (box 12). The wafer is placed in a RIE (reactive ion etch) reactor (box 14) and a chlorine (Cl) containing plasma is generated in the RIE reactor by injecting a gas containing chlorine, preferably $BCl_3$ and $Cl_2$, and supplying a RF current between the electrodes of the RIE reactor. Additionally, carbon tetrafluoride ($CF_4$) is injected into the RIE.

The dry etching process of the RIE using chlorine containing plasma results in anisotropic etching. Specifically, $BCL_x$ ions are pulled into the wafer with tremendous force normal to the wafer due to a negative bias on the surface of the wafer. This allows sputtering of the aluminum oxide layer which must be removed prior to etching. After the oxide layer is removed, the quantity of $Cl_2$ is increased into the RIE and the $Cl_2$ diffuses onto the aluminum. The $Cl_2$ begins to etch vertically down due to the volatility of $AlCl_3$, continuous sputtering from the $BCl_x$ ions, and wall protection caused by the reaction of the $CF_4$ with Al to form the compound $AlF_3$. Those skilled in the art will recognize that $AlF_3$ will not react with $Cl_2$ and therefore forms a protective surface of the vertically etched walls.

After the Al has been etched, the chlorine containing plasma is removed from inside the RIE reactor and oxygen is injected. An oxygen plasma is generated within the RIE reactor. The oxygen plasma removes the photoresist from the wafer and forms an oxide layer on the exposed Al surface.

The final step in the process is removal of the wafer and rinsing it in a nitric acid solution. The nitric acid removes all remaining chlorides which may etch the Al when exposed to moisture in the air.

The followings example shows the method of the present invention on a wafer having a $LiNbO_3$ substrate. Aluminum is disposed on the substrate surface, and a photoresist layer is developed on top of the aluminum according to a determined mask. The wafer is then secured to the RIE electrode.

At the start of the etching process, a gas comprising largely boron trichloride ($BCl_3$) and a minority of $Cl_2$ is injected into the RIE reactor. An RF current is placed across the RIE reactor electrodes to generate a chlorine containing plasma. Within the plasma are positively charged $BCl_x$ ions. Free electrons are accumulated at the surface of the wafer due to the RF current creating a negative bias. The negative bias then pulls the $BCl_x$ ions perpendicularly into the wager causing tremendous molecular impacts.

The impact of the $BCl_x$ ions sputters the native aluminum oxide layer, inherent on all aluminum surfaces exposed to air, to expose the underlying aluminum. This oxide layer would otherwise inhibit the chemical etching process.

After the oxide has been etched, the $BCl_3$ is reduced and the $Cl_2$ is increased to enhance the chemical etching component.

The $Cl_2$ diffuses onto the exposed aluminum and reacts with the Al. To avoid lateral etching, a small amount of $CF_4$ is maintained within the RIE. The $CF_4$ creates the $AlF_3$ side wall protection.

The residue from the etching process is removed by a vacuum system within the RIE reactor.

After a suitable etch end-point has been reached, the chlorine plasma is removed and the oxygen plasma is generated to provide in situ removal of the photoresist and generation of an aluminum oxide layer. Subsequently, the wafer is removed from the RIE reactor and dipped into the nitric acid solution.

The above process has been shown to fabricate aluminum electrodes on piezoelectric substrates having weights of approximately 0.6 microns for SAW devices.

Thus there has been provided, in accordance with the present invention, a reactive ion etching process that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A method of fabricating very small electrical conducting lines for a SAW (surface acoustic wave) device comprising the steps of:
    fabricating a wafer having a piezoelectric substrate which is not readily etched with fluorine;
    depositing an aluminum containing electrical conducting material on said substrate wherein said electrical conducting material is readily etched with chlorine;
    developing an etch resist material on said electrical conducting material according to a predetermined pattern;
    placing said wafer in a RIE (reactive ion etching) reactor;
    etching said electrical conducting material with a chlorine and fluorine containing plasma in said RIE reactor;
    removing said etch resist material; and
    passivating said wafer.

2. A method according to claim 1 wherein said step of etching said conducting material comprises the steps of:
    injecting a gas containing chlorine and fluorine into said RIE;
    placing a RF current across said gas;
    removing an oxide layer on said conducting material by sputter etching said oxide layer with ion bombardment;
    etching said conducting material with said chlorine to produce a side wall extending into said conducting material where etched; and
    chemical reacting said fluorine with said aluminum containing material to generate aluminum trifluoride material on said side wall.

3. A method according to claim 1 wherein said step of fabricating a wafer having a piezoelectric substrate comprise the step of fabricating a piezoelectric substrate using a $LiNbO_3$ (lithium niobate) or a single crystal quartz material.

4. A method according to claim 1 wherein said etching step comprises exposing said electrical conducting material to a plasma formed in a gas containing carbon tetrafluoride.

5. A method of fabricating an electro-acoustic device on a wafer of lithium niobate ($LiNbO_3$) or single crystal quartz comprising the steps of:
    depositing an aluminum containing electrical conducting material on said substrate;
    developing an etch resist material on said electrical conducting material according to a predetermined pattern;
    placing said wafer in a RIE (reactive ion etching) reactor;
    etching said electrical conducting material with a chlorine and fluorine containing plasma in said RIE reactor;
    removing said etch resist material; and
    passivating said wafer.

6. A method according to claim 5 wherein said step of etching said conducting material comprises the steps of:
    injecting a gas containing chlorine and fluorine into said RIE;
    placing a RF current across said gas;
    removing an oxide layer on said conducting material by sputter etching said oxide layer with ion bombardment;
    etching said conducting material with said chlorine; and
    chemical reacting said fluorine with said aluminum to generate an aluminum trifluoride region on a side wall etched in said conducting material.

7. The method of claim 6 wherein said injecting step comprises injecting carbon tetrafluoride.

8. A method for forming an electronic device, comprising:
    providing a substrate composing a piezoelectric material and having a principal surface;
    forming an aluminum containing electrically conducting layer on said principal surface;
    providing an etch resistant mask covering a first portion of said layer and having openings therethrough over a second portion of said layer; and
    etching said second portion of said layer with a chlorine and fluorine containing plasma to etch through said layer under said openings, thereby creating an exposed sidewall extending through said layer.

9. The method of claim 8 wherein said etching step comprises exposing said layer to a gas containing carbon tetrafluoride.

10. The method of claim 9 further comprising, forming an aluminum fluoride on said sidewall.

* * * * *